United States Patent
Song (10) Patent No.: US 12,424,280 B2
(45) Date of Patent: Sep. 23, 2025

(54) SEMICONDUCTOR DEVICE, AND METHOD FOR OPERATING THE SAME

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 169 days.

(21) Appl. No.: 18/159,469

(22) Filed: Jan. 25, 2023

(65) Prior Publication Data

US 2024/0038302 A1 Feb. 1, 2024

(30) Foreign Application Priority Data

Jul. 27, 2022 (KR) .................. 10-2022-0093201

(51) Int. Cl.
*G11C 29/04* (2006.01)
*G11C 13/00* (2006.01)
(Continued)

(52) U.S. Cl.
CPC ...... *G11C 13/0064* (2013.01); *G11C 13/0033* (2013.01); *G11C 13/0069* (2013.01); *G11C 29/04* (2013.01); *G11C 29/50008* (2013.01); *G11C 29/88* (2013.01); *H10B 63/20* (2023.02); *H10B 63/22* (2023.02); *H10B 63/24* (2023.02);
(Continued)

(58) Field of Classification Search
CPC ............ G11C 13/0064; G11C 13/0033; G11C 13/0069; G11C 29/04; G11C 29/50008; G11C 29/88; G11C 11/1659; G11C 11/1677; G11C 11/2259; G11C 13/0004; G11C 13/003; G11C 2029/5006; G11C 2213/76; G11C 2029/5004; G11C 11/005; G11C 17/16; G11C 16/10; G11C 16/3459; H10B 63/20; H10B 63/22; H10B 63/24; H10B 63/80; H10B 63/84; H10B 63/30; H10N 70/826
See application file for complete search history.

(56) References Cited

U.S. PATENT DOCUMENTS 9,793,323 B1 * 10/2017 Lung ................ H10B 63/24
11,948,630 B2 * 4/2024 Nardi ................ G11C 17/16
(Continued)

FOREIGN PATENT DOCUMENTS

KR 20170137562 A 12/2017

*Primary Examiner* — Amir Zarabian
*Assistant Examiner* — Justin Bryce Heisterkamp
(74) *Attorney, Agent, or Firm* — Perkins Coie LLP (57) ABSTRACT

A semiconductor device may include: a plurality of first conductive lines extending in a first direction; a plurality of second conductive lines extending in a second direction; a plurality of memory cells respectively disposed at intersection regions between the first conductive lines and the second conductive lines; and a layer formed between each memory cell and at least one of a first conductive line and an intersecting second conductive line between which the memory cell is located, wherein the layer includes a conductive material that is capable of generating a void to create an open circuit by electromigration when a current applied to the layer through the first conductive line and the second conductive line exceeds a threshold current and is electrically conductive when the current applied to the layer through the first conductive line and the second conductive line is below the threshold current.

15 Claims, 4 Drawing Sheets

(51) Int. Cl.
  *G11C 29/00* (2006.01)
  *G11C 29/50* (2006.01)
  *H10B 63/00* (2023.01)
  *H10N 70/00* (2023.01)
  *G11C 11/16* (2006.01)
  *G11C 11/22* (2006.01)

(52) U.S. Cl.
  CPC ............ *H10B 63/80* (2023.02); *H10B 63/84* (2023.02); *H10N 70/826* (2023.02); *G11C 11/1659* (2013.01); *G11C 11/1677* (2013.01); *G11C 11/2259* (2013.01); *G11C 13/0004* (2013.01); *G11C 13/003* (2013.01); *G11C 2029/5006* (2013.01); *G11C 2213/76* (2013.01); *H10B 63/30* (2023.02)

(56) References Cited

U.S. PATENT DOCUMENTS

| | | | |
|---|---|---|---|
| 2011/0199811 A1* | 8/2011 | Kanno | G11C 8/10 |
| | | | 365/148 |
| 2013/0286711 A1* | 10/2013 | Lung | G11C 17/06 |
| | | | 365/148 |
| 2017/0018499 A1* | 1/2017 | Chen | H01L 23/5283 |
| 2018/0158870 A1 | 6/2018 | Apodaca et al. | |
| 2022/0319629 A1* | 10/2022 | Ciocchini | G11C 29/04 |
| 2023/0402369 A1* | 12/2023 | Chang | G11C 17/16 |
| 2023/0413693 A1* | 12/2023 | Song | H10B 63/10 |

\* cited by examiner

SEMICONDUCTOR DEVICE, AND METHOD FOR OPERATING THE SAME

PRIORITY CLAIM AND CROSS-REFERENCE TO RELATED APPLICATION

This patent document claims the priority and benefits of Korean Patent Application No. 10-2022-0093201 filed on Jul. 27, 2022, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on, high-performance, high capacity semiconductor devices. Examples of such high-performance, high-capacity semiconductor devices include memory devices that can store data by switching between different resistance states according to an applied voltage or current, such as an RRAM (resistive random access memory), a PRAM (phase change random access memory), an FRAM (ferroelectric random access memory), an MRAM (magnetic random access memory), an electronic fuse (E-fuse).

SUMMARY

In some embodiments, a semiconductor device may include: a plurality of first conductive lines extending in a first direction; a plurality of second conductive lines spaced apart from the first conductive lines and extending in a second direction different from the first direction to intersect the plurality of first conductive lines; a plurality of memory cells respectively disposed at intersection regions between the first conductive lines and the second conductive lines such that each memory cell is located between a first conductive line and an intersecting second conductive line; and a layer formed between each memory cell and at least one of a first conductive line and an intersecting second conductive line between which the memory cell is located, wherein the layer includes a conductive material that is capable of generating a void to create an open circuit by electromigration when a current applied to the layer through the first conductive line and the second conductive line exceeds a threshold current and is electrically conductive when the current applied to the layer through the first conductive line and the second conductive line is below the threshold current.

In some embodiments, a semiconductor device may include: a plurality of first conductive lines extending in a first direction; a plurality of second conductive lines spaced apart from the first conductive lines and extending in a second direction intersecting the first direction; a plurality of memory cells disposed at intersection regions where the first conductive lines vertically overlap the second conductive lines; and a layer formed between the memory cell and at least one of the first conductive line and the second conductive line, wherein the plurality of memory cells includes a defective memory cell in which a short failure has occurred, and wherein the layer connected to the defective memory cell is configured to block an electrical connection between the defective memory cell and at least one of the first conductive line or the second conductive line.

In some embodiments, a method for operating a semiconductor device may include: a plurality of first conductive lines extending in a first direction; a plurality of second conductive lines spaced apart from the first conductive lines and extending in a second direction intersecting the first direction; a plurality of memory cells disposed at intersection regions where between the first conductive lines vertically overlap the second conductive lines; and a layer formed between the memory cell and at least one of the first conductive line or the second conductive line and allowing or blocking an electrical connection between the memory cell and at least one of the first conductive line or the second conductive line, the method comprising: performing a program operation on one of the plurality of memory cells; verifying whether the program operation has been successfully performed; and as a result of the verification, in a case that the one memory cell is stuck in a low resistance state, allowing the layer to block the electrical connection between the one memory cell and at least one of the first conductive line or the second conductive line.

DETAILED DESCRIPTION

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1:
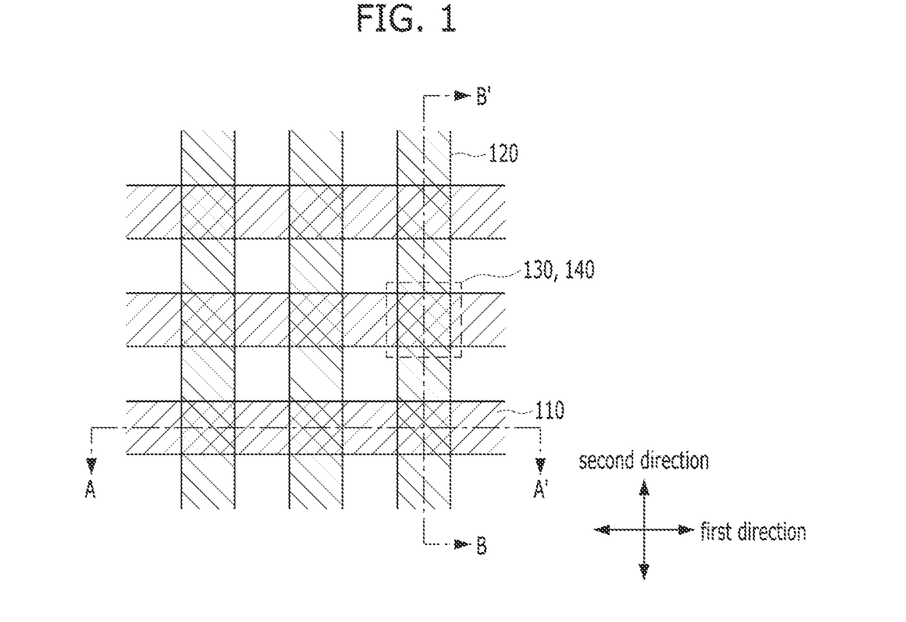
FIG. 1 illustrates an example a semiconductor device based on some embodiments of the disclosed technology.
Figure 2:
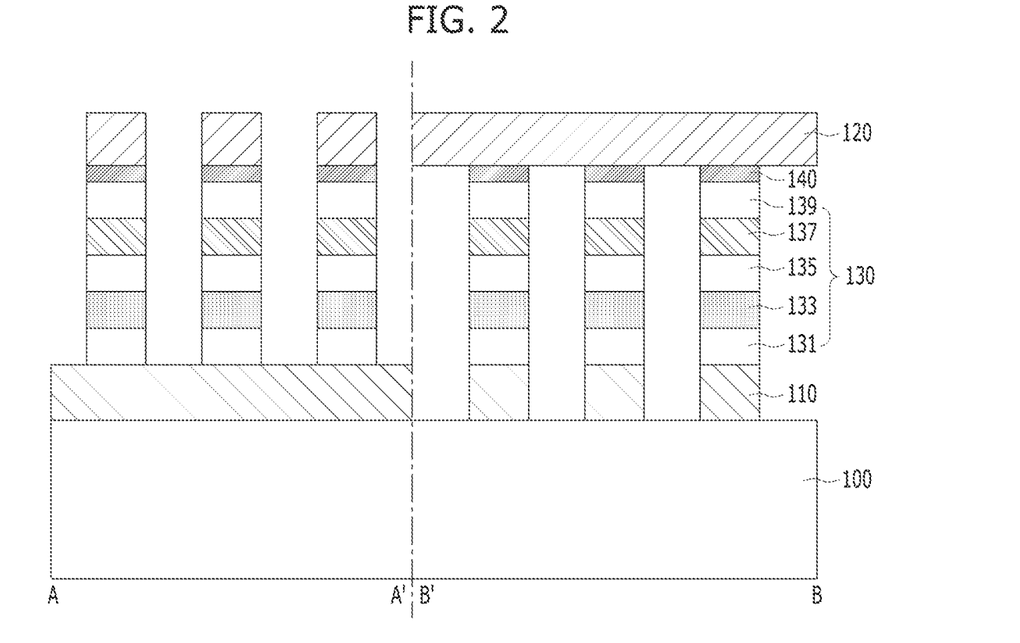
FIG. 2 illustrates an example a semiconductor device based on some embodiments of the disclosed technology.

FIGS. 1 and 2 are views illustrating a semiconductor device based on some embodiments of the disclosed technology. FIG. 1 is a plan view, and FIG. 2 is a cross-sectional view taken along lines A-A' and B-B' of FIG. 1.

Referring to FIGS. 1 and 2, the semiconductor device based on some embodiments may include a substrate 100, a plurality of first conductive lines 110 formed over the substrate 100 and extending in a first direction, a plurality of second conductive lines 120 formed over first conductive lines 110 to be spaced apart from the first conductive lines 110 and extending in a second direction intersecting the first direction, a plurality of memory cells 130 respectively overlapping intersection regions of the first conductive lines 110 and the second conductive lines 120 (e.g., intersection regions where the first conductive lines 110 vertically overlap the second conductive lines 120), and an open layer 140 interposed between the memory cell 130 and the second conductive line 120.

The substrate 100 may include a semiconductor material such as silicon. A certain lower structure (not shown) may be formed in the substrate 100. For example, the substrate 100 may include a driving circuit (not shown) electrically connected to the first conductive line 110 and/or the second conductive line 120 to control operations associated with the first conductive line 110 and/or the second conductive line 120.

The first conductive line 110 and the second conductive line 120 may include at least one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof, and may have a single-layer structure or a multi-layer structure. The first conductive line 110 and the second conductive line 120 may be respectively connected to a lower and an upper end of the memory cell 130 to transmit a voltage or current to the memory cell 130 to activate or perform read or write operations on the memory cell 130. When the first conductive line 110 functions as a word line, the second conductive line 120 may function as a bit line. Conversely, when the first conductive line 110 functions as a bit line, the second conductive line 120 may function as a word line.

The memory cell 130 may include a variable resistance element that stores data indicated by different resistance states by switching between different resistance states according to a voltage or current applied through the first conductive line 110 and the second conductive line 120. In a plan view, the memory cell 130 may have a rectangular shape in which both sidewalls in the first direction are aligned with the second conductive line 120, and both sidewalls in the second direction are aligned with the first conductive line 110. However, the present disclosure is not limited thereto, and as long as the memory cell 130 overlaps each of the intersection regions of the first conductive lines 110 and the second conductive lines 120, the arrangement of the memory cell 130 may be variously modified.

As an example, the memory cell 130 may include a stacked structure of a lower electrode layer 131, a selector layer 133, an intermediate electrode layer 135, a variable resistance layer 137, and an upper electrode layer 139.

The lower electrode layer 131 may be interposed between the first conductive line 110 and the selector layer 133, and may function to electrically connect the first conductive line 110 to the selector layer 133 while physically separating them. The intermediate electrode layer 135 may be interposed between the selector layer 133 and the variable resistance layer 137 to electrically connect the selector layer 133 to the variable resistance layer 137 while physically separating them. The upper electrode layer 139 may be interposed between the variable resistance layer 137 and the second conductive line 120, and may function to electrically connect the variable resistance layer 137 to the second conductive line 120 while physically separating them. The lower electrode layer 131, the intermediate electrode layer 135, or the upper electrode layer 139 may include at least one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof. Alternatively, the lower electrode layer 131, the intermediate electrode layer 135, or the upper electrode layer 139 may include a carbon layer.

The selector layer 133 may function to prevent or reduce current leakage which may occur between the memory cells 130 sharing the first conductive line 110 or the second conductive line 120. To this end, the selector layer 133 may have a threshold switching characteristic, that is, a characteristic for blocking or substantially limiting current when a magnitude of an applied voltage is less than a predetermined threshold value and for allowing current to abruptly increase above the threshold value. The threshold value may be referred to as a threshold voltage, and the selector layer 133 may be implemented in a turned-on state or a turned-off state based on the threshold voltage. The selector layer 133 may include at least one of a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$, $VO_2$, or a tunneling insulating layer having a relatively wide band gap, such as $SiO_2$, $Al_2O_3$.

The variable resistance layer 137 may store data in the memory cell 130 via different resistance states of the variable resistance layer 137. To this end, the variable resistance layer 137 may have a variable resistance characteristic that switches between different resistance states according to an applied voltage so that the different resistance states represent different data (e.g., "1" or "0"). The variable resistance layer 137 may have a single-layer structure or a multi-layer structure including at least one of materials used for an RRAM, a PRAM, an MRAM, or an FRAM, for example, a metal oxide such as a perovskite-based oxide or a transition metal oxide, a phase change material such as a chalcogenide-based material, a ferromagnetic material, or a ferroelectric material.

In implementations, the structure of the memory cell 130 may be variously modified. As an example, at least one of the lower electrode layer 131, the intermediate electrode layer 135, the upper electrode layer 139, and the selector layer 133 may be omitted. Alternatively, as an example, the memory cell 130 may further include one or more layers, in addition to the above layers 131, 133, 135, 137, and 139, to improve characteristics of the memory cell 130. Alternatively, as an example, the upper and lower positions of the variable resistance layer 137 and the selector layer 133 may be reversed with each other. Alternatively, as an example, the memory cell 130 may have a structure in which a layer simultaneously performing a function as a memory layer and a function as a selector layer is interposed between the lower electrode layer 131 and the upper electrode layer 139, and thus, the memory cell 130 may function as a self-selecting memory cell.

A space between the first conductive lines 110, between the second conductive lines 120, and between the memory cells 130 may be filled with an insulating material (not shown).

In some implementations, when the memory cell 130 is activated, an excessive current (e.g., an overshooting current or a spike current) may flow through the memory cell 130 unintentionally, thereby leading to a short failure (e.g., a short circuit failure) of the memory cell 130. For convenience of description, the memory cell 130 in which the short failure occurred will be referred to as a defective memory cell, and the memory cell 130 in which the short failure has not occurred will be referred to as a normal memory cell. Since the defective memory cell 130 passes the supplied current as it is, it can no longer be activated normally to exhibit different resistance states as in a normal memory cell.

However, since the defective memory cell 130 may allow a current to pass through the defective memory cell 130, this current passing through the defective memory cell 130 becomes part of the leakage current in the entire semiconductor device which may increase. This increase in the leakage current in the entire semiconductor device may reduce the current that is applied to a normal memory cell 130, thereby disturbing the normal memory cell 130 from being activated because, when the leakage current increases, more current is required to activate the normal memory cell 130.

In some embodiments, even if there is the defective memory cell 130, the current flow through the defective memory cell 130 may be blocked and/or reduced, and thus, the leakage current in the semiconductor device may be minimized or reduced. To this end, the disclosed technology can be implemented in some embodiments to provide the open layer 140 interposed between each memory cell 130 and each second conductive line 120 to mitigate the above undesired increase in the leakage current due to presence of one or more defective memory cells.

The open layer 140 may be formed over each of the memory cells 130. That is, in a plan view, the open layer 140 may be disposed to overlap each of the memory cells 130. As an example, the open layer 140 may have a sidewall aligned with a sidewall of the memory cell 130 by being patterned together with the memory cell 130. However, the present disclosure is not limited thereto, and the open layer 140 may have an island shape overlapping each of the memory cells 130, and may have a sidewall that is at least partially not aligned with the sidewall of the memory cell 130. Also, the structure and/or arrangement of the open layer 140 may be variously modified.

In some implementations, the open layer 140 may be a material layer that can transition to an "open" state depending on a voltage or current applied to the open layer 140.

The open layer 140 may be formed of a material which exhibits a conductive characteristic or is electrically conductive when the material of the open layer 140 is in a normal state when the voltage or current applied to the open layer 140 through the first and second conductive lines 110 and 120 does not exceed a predetermined threshold value. Thus, the open layer 140 in the normal state may electrically connect the memory cell 130 to the second conductive line 120 between the memory cell 130 and the second conductive line 120. However, when the voltage or current applied to the open layer 140 through the first and second conductive lines 110 and 120 exceeds a predetermined threshold value, the conductivity of the open layer 140 may decrease to a low level that may block the electrical connection between the memory cell 130 and the second conductive line 120. That is, the open layer 140 may be in an "open" state to effectuate an open circuit at the open layer 140. As an example, the open layer 140 may include a material that is electrically conductive when the current density of the electrical current through the open layer 140 is small and capable of generating a void therein by electromigration when its current density is larger than a specific threshold current density. The void may be an empty space, and may exhibit an insulating property by being in a vacuum state or filled with air or a low-conductivity material. When the void is generated in the open layer 140, the electrical connection between the memory cell 130 and the second conductive line 120 may be cut off, so that the flow of current through the memory cell 130 in which the short failure occurred may be blocked. This will be described in more detail below with reference to FIG. 3.

Figure 3:
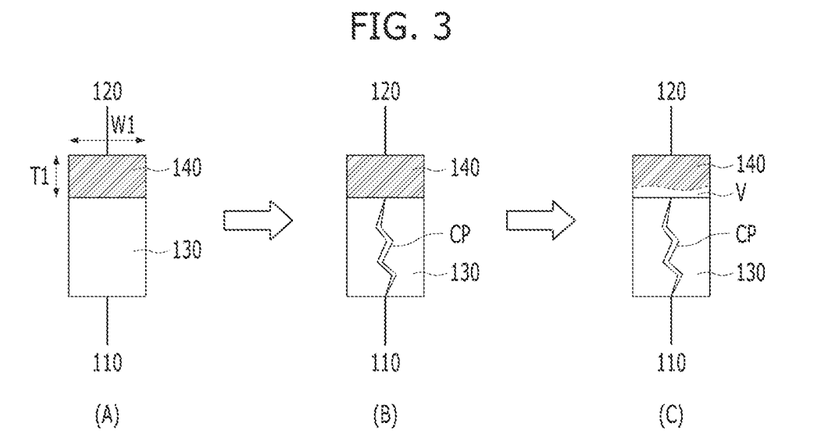
FIG. 3 illustrates states of the memory cell 130 and the open layer 140 when the semiconductor device of FIG. 2 is activated.

FIG. 3 illustrates an example of states of the memory cell 130 and the open layer 140 when the semiconductor device of FIG. 2 is activated to illustrate how the open layer 140 can be used to reduce the impact of one or more defective memory cells.

FIG. 3(A) shows a case where the open layer 140 is in its normal state in which no void is formed in the open layer 140 and the open layer 140 is electrically conductive. The open layer is disposed over the normal memory cell 130 in which a short failure has not occurred). Since the open layer 140 is a conductive material at this state in FIG. 3(A), an electrical connection between the memory cell 130 and the second conductive line 120 may be enabled. In this case, the memory cell 130 may be normally activated by applying various driving voltages through the first and second conductive lines 110 and 120. For example, a program operation for changing the resistance state of the memory cell 130 from a low resistance state to a high resistance state or from a high resistance state to a low resistance state may be performed.

FIG. 3(B) shows a case where the open layer 140 that is not in an open state is disposed over a defective memory cell 130 in which the short failure has occurred. In the defective memory cell 130 in which the short failure has occurred, a current path CP passing through the memory cell 130 between the upper end and the lower end of the memory cell 130 may be generated. Since the current path CP in the defective memory cell 130 is permanent, a program operation for changing the resistance state of the memory cell 130 may not be possible even when a driving voltage is applied through the first and second conductive lines 110 and 120. This may occur when an excessive current flows unintentionally in the memory cell 130 of FIG. 3(A). Furthermore, in the case in FIG. 3(B), the void is not formed in the open layer 140 despite an excessive current that causes a short failure of the memory cell 130. This is because the excessive current for causing a short failure of the memory cell 130 is lower than the current density that generates the void in the open layer 140. In this case, since the open layer 140 is a conductive material, the current may flow between the first conductive line 110 and the second conductive line 120 through the defective memory cell 130 and the open layer 140. Accordingly, during a read operation, the defective memory cell 130 may appear to be stuck in a low resistance state.

FIG. 3(C) shows a case in which the open layer 140 that is in an open state due to the formation of a void V is disposed over the defective memory cell 130 in which the short failure has occurred. In the defective memory cell 130 in which the short failure has occurred, a current path CP passing through the memory cell 130 between the upper end and the lower end of the memory cell 130 may be generated. Since the current path CP of the defective memory cell 130 is permanent, a program operation for changing the resistance state of the memory cell 130 may not be possible even when a driving voltage is applied through the first and second conductive lines 110 and 120. However, in the example illustrated in FIG. 3(C), since the void V of the open layer 140 is located over the memory cell 130, the open layer 140 may block the current flow through the memory cell 130 despite a short failure of the memory cell 130. As a result, the current flow between the first conductive line 110 and the second conductive line 120 may be blocked. In other words, the memory cell 130 itself may be in a state in which a short failure has occurred, but during its activation period, the defective memory cell 130 in FIG. 3(C) may be recognized as the memory cell 130 in an open state, that is, the memory cell 130 in a state in which current flow is blocked, due to the open layer 140. Accordingly, during a read operation, the defective memory cell 130 in FIG. 3(C) may appear to be stuck in a high resistance state. This may occur, from the state of FIG. 3(A), when an excessive current flows unintentionally through the memory cell 130, resulting in a short failure of the memory cell 130 and a void due to electromigration in the open layer 140. This is because the excessive current is greater than the current density to generate the void in the open layer 140. Alternatively, this may occur, from the state of (B) of FIG. 3, when an additional voltage or current is applied to generate the void due to electromigration in the open layer 140. However, since the void should not be formed in the open layer 140 when the memory cell 130 is activated, the magnitude of the additional voltage or current may be greater than the magnitude of the operating voltage or current.

Referring back to FIG. 2, various conductive materials that are easily transported due to electromigration phenomena may be used as the open layer 140. As an example, a metal material having a relatively low melting point or an activation energy proportional thereto may be used as the open layer 140. For example, a metal having an activation energy lower than 2 eV, such as Al, Mg, Zn, Te, Ag, Cu, Mn, and Ti, or an alloy of the metal may be used as the open layer 140.

The semiconductor device implemented based on some embodiments of the disclosed technology described above can prevent and/or reduce leakage current by blocking and/or reducing current flow through the memory cell 130 in which the short failure has occurred by the open layer 140. As a result, since the leakage current does not adversely affect the normal operation of the memory cell 130, the operating characteristics of the semiconductor device may be improved.

As discussed above, in some implementations, the open layer 140 is positioned over the memory cell 130, for example, over the memory cell 130, but the present disclosure is not limited thereto. The open layer 140 may be positioned under the memory cell 130. Alternatively, the open layer 140 may be positioned under and over the memory cell 130, respectively, as will be discussed below with reference to FIG. 4.

Figure 4:
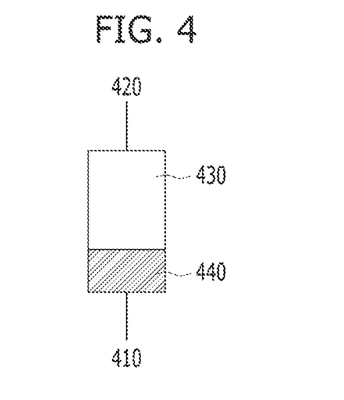
FIG. 4 illustrates an example of a semiconductor device based on some embodiments of the disclosed technology.

FIG. 4 illustrates an example of a semiconductor device based on some embodiments of the disclosed technology. FIG. 4 shows one memory cell, one open layer connected thereto, and first and second conductive lines connected thereto.

Referring to FIG. 4, a stacked structure of an open layer 440 and a memory cell 430 may be interposed between the first conductive line 410 and the second conductive line 420. That is, the open layer 440 may be positioned under the memory cell 430.

When a short failure occurs in the memory cell 430, the open layer 440 connected thereto may cut off the electrical connection between the memory cell 430 and the first conductive line 410, thereby preventing the current flow between the first conductive line 410 and the second conductive line 420 through the memory cell 430. The open layer 440 may include a material capable of generating a void therein by electromigration when its current density is larger than a specific current density. The void in the open layer 440 may be formed under the lower surface of the memory cell 430.

In some implementations, as illustrated in FIGS. 1 to 3, the case in which the open layer 140 is aligned with the sidewall of the memory cell 130 and has the same width as the memory cell 130 has been described, but the present disclosure is not limited thereto. This will be described by way of example with reference to FIG. 5.

Figure 5:
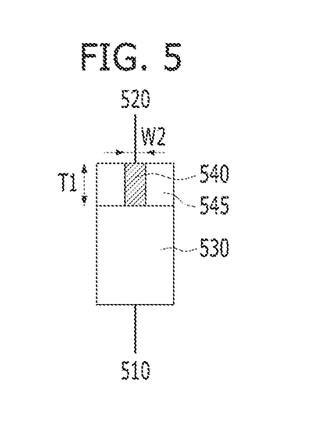
FIG. 5 illustrates an example of a semiconductor device based on some embodiments of the disclosed technology.

FIG. 5 illustrates an example of a semiconductor device based on some embodiments of the disclosed technology. FIG. 5 shows one memory cell, one open layer connected thereto, and first and second conductive lines connected thereto.

Referring to FIG. 5, a stacked structure of a memory cell 530 and an open layer 540 may be interposed between the first conductive line 510 and the second conductive line 520.

Here, the width W2 and/or the planar size of the open layer 540 may be smaller than the width and/or the planar size of the memory cell 530. This width W2 may be smaller than the width (refer to W1 of FIG. 3) of the open layer of the above-described embodiment. In this case, a void may be formed in the open layer 540 even under a current density smaller than that of the above-described embodiment. This is because the smaller the width W2 of the open layer 540 is, the easier it is to form the void.

A sidewall of the open layer 540 may be surrounded by an insulating layer 545. The insulating layer 545 may include various insulating materials such as silicon oxide, silicon nitride, metal oxide, metal nitride, or a combination thereof. The open layer 540 may be formed separately from the memory cell 530, that is, by patterning the open layer 540 using a mask different from the mask for forming the memory cell 530. Alternatively, after the open layer 540 is patterned together with the memory cell 530, the open layer 540 may be partially oxidized or nitrified from the sidewall of the open layer 540 while protecting the sidewall of the memory cell 530.

In some implementations, as illustrated in FIG. 3, it is indicated that the open layer 140 has a predetermined thickness T1. The thickness T1 may be variously adjusted. This will be described by way of example with reference to FIG. 6.

Figure 6:
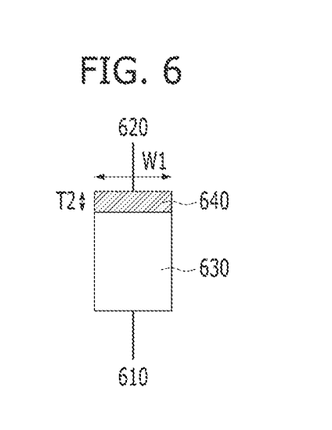
FIG. 6 illustrates an example of a semiconductor device based on some embodiments of the disclosed technology.

FIG. 6 illustrates an example of a semiconductor device based on some embodiments of the disclosed technology. FIG. 6 shows one memory cell, one open layer connected thereto, and first and second conductive lines connected thereto.

Referring to FIG. 6, a stacked structure of a memory cell 630 and an open layer 640 may be interposed between the first conductive line 610 and the second conductive line 620.

Here, the thickness T2 of the open layer 640 may be smaller than the thickness of the open layer of the above-described embodiment (refer to T1 of FIG. 3). In this case, a void may be formed in the open layer 640 even under a current density smaller than that of the above-described embodiment. This is because the smaller the thickness T2 of the open layer 640 is, the easier it is to form the void.

Figure 7:
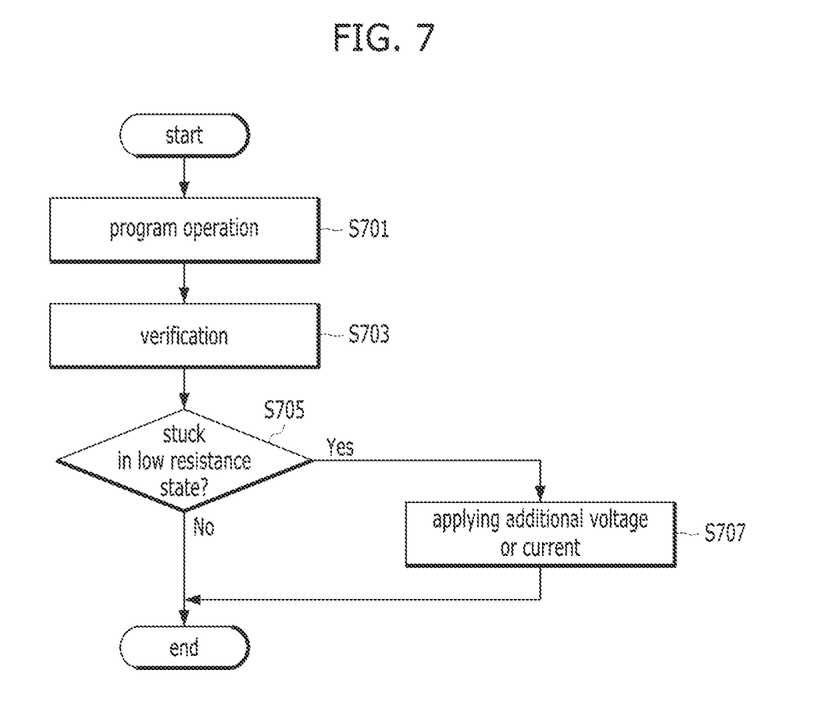
FIG. 7 is a flowchart illustrating a method of operating a semiconductor device based on some embodiments of the disclosed technology.

FIG. 7 is a flowchart illustrating a method of operating a semiconductor device based on some embodiments of the disclosed technology.

Referring to FIG. 7, at S701, a program operation for changing the resistance state of a selected memory cell may be performed.

At S703, it may be verified whether the program operation of the selected memory cell is normally performed. The verification may be performed by applying a read voltage to the memory cell. When it is verified that the memory cell is normally programmed, for example, in the state (A) of FIG. 3, there is no problem. Also, even if the memory cell is not normally programmed, it does not matter if the memory cell appears to be stuck in a high resistance state, for example, in the state (C) of FIG. 3 because if the memory cell is stuck in the high resistance state, it does not become a path for current leakage. On the other hand, when the memory cell is not normally programmed and appears to be stuck in a low resistance state, for example, in the state (B) of FIG. 3, the memory cell becomes a path for current leakage. Accordingly, the following steps S705 and S707 may be performed to address this issue.

As a result of the verification at S703, when the memory cell is stuck in the low resistance state, an additional voltage or current may be applied to the memory cell at 707. This additional voltage or current may have a magnitude to enable formation of a void in an open layer that overlaps and connects with the memory cell above and/or below the memory cell. Furthermore, the magnitude of the additional voltage or current may be greater than the magnitude of the program voltage or current during the program operation. As a result, the memory cell may be stuck in the high resistance state.

On the other hand, as a result of the verification at S703, when the memory cell is normally programmed or stuck in the high resistance state, the operation may be terminated.

In some embodiments of the disclosed technology, it may be possible to improve the operating characteristics of the semiconductor device.

Although various embodiments have been described for illustrative purposes, it should be understood that modifications to the disclosed embodiments and other embodiments based on what is described and/or illustrated in this patent document.

What is claimed is:

1. A semiconductor device comprising:
a plurality of first conductive lines extending in a first direction;
a plurality of second conductive lines spaced apart from the first conductive lines and extending in a second direction intersecting the first direction;
a plurality of memory cells respectively disposed at intersection regions between the first conductive lines and the second conductive lines such that each memory cell is located between a first conductive line and a second conductive line; and
a plurality of layers respectively formed between each memory cell of the plurality of memory cells and either a corresponding first conductive line or a corresponding second conductive line,
wherein each layer of the plurality of layers includes a conductive material that is capable of generating a void to create an open circuit by electromigration when a current applied to a layer through a first conductive line corresponding to the layer and a second conductive line corresponding to the layer exceeds a threshold current and is electrically conductive when the current applied to the layer is below the threshold current.

2. The semiconductor device according to claim 1, wherein the plurality of memory cells includes a defective memory cell in which a short circuit failure has occurred, and wherein one layer of the plurality of layers connected to the defective memory cell includes the void.

3. The semiconductor device according to claim 1, wherein the plurality of memory cells includes a normal memory cell in which a short circuit failure has not occurred, and wherein one layer of the plurality of layers connected to the normal memory cell does not include the void.

4. The semiconductor device according to claim 2, wherein an electrical connection between the defective memory cell and either a first conductive line corresponding to the defective memory cell or a second conductive line corresponding to the defective memory cell is blocked by the one layer with the void.

5. The semiconductor device according to claim 3, wherein an electrical connection between the normal memory cell and either a first conductive line corresponding to the normal memory cell or a second conductive line corresponding to the normal memory cell is allowed by the one layer without the void.

6. The semiconductor device according to claim 1, wherein each layer of the plurality of layers includes a metal material having an activation energy lower than 2e V.

7. The semiconductor device according to claim 1, wherein a sidewall of each layer of the plurality of layers is aligned with a sidewall of each memory cell of the plurality of memory cells, respectively.

8. The semiconductor device according to claim 2, wherein a width of each layer of the plurality of layers is smaller than a width of each memory cell of the plurality of memory cells, respectively.

9. A semiconductor device comprising:
a plurality of first conductive lines extending in a first direction;
a plurality of second conductive lines spaced apart from the plurality of first conductive lines and extending in a second direction intersecting the first direction;
a plurality of memory cells disposed at intersection regions where the plurality of first conductive lines vertically overlap the plurality of second conductive lines; and
a plurality of layers respectively formed between each memory cell of the plurality of memory cells and either a corresponding first conductive line or a corresponding second conductive line, wherein the plurality of layers respectively includes a conductive material capable of generating a void by electromigration,
wherein the plurality of memory cells includes a defective memory cell in which a short circuit failure has occurred, and
wherein a first layer of the plurality of layers is connected to the defective memory cell, and the first layer connected to the defective memory cell is configured to block an electrical connection between the defective memory cell and either a first conductive line corresponding to the defective memory cell or a second conductive line corresponding to the defective memory cell.

10. The semiconductor device according to claim 9, wherein the plurality of memory cells further includes a normal memory cell in which a short circuit failure has not occurred, wherein a second layer of the plurality of layers is connected to the normal memory cell, and the second layer connected to the normal memory cell allows an electrical connection between the normal memory cell and either a first conductive line corresponding to the normal memory cell or a second conductive line corresponding to the normal memory cell.

11. The semiconductor device according to claim 9, wherein the first layer connected to the defective memory cell includes a void.

12. The semiconductor device according to claim 10, wherein the first layer connected to the defective memory cell includes a void, and
wherein the second layer connected to the normal memory cell does not include a void.

13. A method for operating a semiconductor device including:
a plurality of first conductive lines extending in a first direction;
a plurality of second conductive lines spaced apart from the first conductive lines and extending in a second direction intersecting the first direction;
a plurality of memory cells disposed at intersection regions where the first conductive lines vertically overlap the second conductive lines; and
a plurality of layers respectively formed between each memory cell of the plurality of memory cells and either a corresponding first conductive line or a corresponding second conductive line,
wherein the plurality of layers respectively includes a conductive material capable of generating a void by electromigration,
the method comprising:
performing a program operation on one of the plurality of memory cells;
verifying whether the program operation has been successfully performed; and
as a result of the verification, in a case that the one memory cell is stuck in a low resistance state, allowing a layer of the plurality of layers corresponding to the one memory cell to block an electrical connection between the one memory cell and either a first conductive line corresponding to the one memory cell or a second conductive line corresponding to the one memory cell.

14. The method according to claim 13,
wherein the allowing the layer of the plurality of layers corresponding to the one memory cell to block the electrical connection includes applying a voltage or current through the first conductive line corresponding to the one memory cell and the second conductive line corresponding to the one memory cell to enable generation of the void.

15. The method according to claim 14, wherein a magnitude of the voltage or current is greater than a magnitude of a program voltage or current applied during the program operation.

* * * * *